(12) United States Patent
Manusharow et al.

(10) Patent No.: US 8,901,748 B2
(45) Date of Patent: Dec. 2, 2014

(54) DIRECT EXTERNAL INTERCONNECT FOR EMBEDDED INTERCONNECT BRIDGE PACKAGE

(71) Applicants: Mathew J. Manusharow, Phoenix, AZ (US); Debendra Mallik, Chandler, AZ (US)

(72) Inventors: Mathew J. Manusharow, Phoenix, AZ (US); Debendra Mallik, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/828,947

(22) Filed: Mar. 14, 2013

(65) Prior Publication Data

US 2014/0264791 A1 Sep. 18, 2014

(51) Int. Cl.
| | |
|---|---|
| H01L 23/48 | (2006.01) |
| H01L 23/52 | (2006.01) |
| H01L 29/40 | (2006.01) |
| H01L 23/34 | (2006.01) |
| H01L 23/02 | (2006.01) |
| H01L 23/58 | (2006.01) |
| H01L 23/498 | (2006.01) |
| H01L 23/00 | (2006.01) |

(52) U.S. Cl.
CPC .......... *H01L 23/49827* (2013.01); *H01L 24/82* (2013.01)
USPC ........... 257/777; 257/652; 257/686; 257/723; 257/778; 257/E25.011; 257/E25.012

(58) Field of Classification Search
CPC ... H01L 23/5386; H01L 24/37; H01L 25/074; H01L 2224/73221; H01L 2224/73263
USPC ............... 257/652, 723, E23.17, E25.011, 257/E25.012, 686, 777, 778
See application file for complete search history.

(56) References Cited

U.S. PATENT DOCUMENTS

| | | | | |
|---|---|---|---|---|
| 5,198,963 | A  * | 3/1993 | Gupta et al. | 361/715 |
| 6,914,322 | B2 * | 7/2005 | Iijima et al. | 257/678 |
| 7,091,607 | B2 * | 8/2006 | Liu | 257/724 |
| 7,106,610 | B2   | 9/2006 | Fahmy et al. | |
| 7,239,213 | B2   | 7/2007 | Dreps et al. | |
| 7,271,461 | B2 * | 9/2007 | Dutta | 257/432 |
| 7,741,151 | B2 * | 6/2010 | Amrine et al. | 438/107 |
| 8,008,125 | B2 * | 8/2011 | McConnelee et al. | 438/109 |
| 8,093,910 | B2   | 1/2012 | Schmatz et al. | |
| 8,163,600 | B2 * | 4/2012 | Chow et al. | 438/109 |
| 8,164,917 | B2 * | 4/2012 | Shi et al. | 361/764 |
| 8,174,103 | B2 * | 5/2012 | Bartley et al. | 257/685 |
| 8,227,904 | B2 * | 7/2012 | Braunisch et al. | 257/686 |
| 8,274,149 | B2 * | 9/2012 | Chang et al. | 257/737 |
| 8,349,649 | B2 * | 1/2013 | Kurita | 438/107 |
| 8,377,746 | B2 * | 2/2013 | Harper et al. | 438/109 |
| 8,536,693 | B2 * | 9/2013 | Dungan et al. | 257/686 |

(Continued)

*Primary Examiner* — Ida M Soward
(74) *Attorney, Agent, or Firm* — Blakely, Sokoloff, Taylor & Zafman LLP

(57) ABSTRACT

An external direct connection usable for an embedded interconnect bridge package is described. In one example, a package has a substrate, a first semiconductor die having a first bridge interconnect region, and a second semiconductor die having a second bridge interconnect region. The package has a bridge embedded in the substrate, the bridge having a first contact area to connect to the first bridge interconnect region and a second contact area to connect to the second bridge interconnect region, and an external connection rail extending between the interconnect bridge and the first and second semiconductor dies to supply external connection to the first and second bridge interconnect regions.

11 Claims, 6 Drawing Sheets

(56) References Cited

U.S. PATENT DOCUMENTS

| | | | |
|---|---|---|---|
| 8,669,656 B2* | 3/2014 | Slupsky et al. | 257/723 |
| 2007/0045815 A1* | 3/2007 | Urashima et al. | 257/698 |
| 2008/0093726 A1* | 4/2008 | Preda et al. | 257/700 |
| 2009/0089466 A1* | 4/2009 | Cunningham et al. | 710/100 |
| 2009/0108427 A1* | 4/2009 | Caron et al. | 257/685 |
| 2011/0215472 A1* | 9/2011 | Chandrasekaran | 257/738 |
| 2011/0285006 A1* | 11/2011 | Weng et al. | 257/686 |
| 2011/0312129 A1* | 12/2011 | Joseph et al. | 438/107 |
| 2012/0068339 A1 | 3/2012 | Miller et al. | |
| 2012/0074580 A1* | 3/2012 | Nalla et al. | 257/774 |
| 2012/0139097 A1* | 6/2012 | Jin et al. | 257/712 |
| 2012/0161331 A1* | 6/2012 | Gonzalez et al. | 257/774 |
| 2012/0220056 A1* | 8/2012 | Shi et al. | 438/3 |
| 2012/0241980 A1* | 9/2012 | Ko et al. | 257/777 |
| 2012/0266464 A1* | 10/2012 | Chow et al. | 29/852 |
| 2013/0029457 A1* | 1/2013 | Simmons-Matthews | 438/113 |
| 2013/0141442 A1* | 6/2013 | Brothers et al. | 345/502 |
| 2013/0186676 A1* | 7/2013 | Yu et al. | 174/257 |
| 2013/0200511 A1* | 8/2013 | Banijamali | 257/737 |
| 2013/0214425 A1* | 8/2013 | Marais et al. | 257/774 |
| 2013/0214432 A1* | 8/2013 | Wu et al. | 257/782 |
| 2014/0070380 A1* | 3/2014 | Chiu et al. | 257/666 |
| 2014/0117552 A1* | 5/2014 | Qian et al. | 257/762 |
| 2014/0159228 A1* | 6/2014 | Teh et al. | 257/734 |
| 2014/0174807 A1* | 6/2014 | Roy et al. | 174/261 |
| 2014/0175636 A1* | 6/2014 | Roy et al. | 257/737 |

* cited by examiner

DIRECT EXTERNAL INTERCONNECT FOR EMBEDDED INTERCONNECT BRIDGE PACKAGE

FIELD

The present description relates to the field of semiconductor die packaging and, in particular, to providing direct external connection to an interconnect area of a die with the package.

BACKGROUND

Packages have been developed that contain two or more semiconductor dies attached to a substrate and an interconnect bridge that has connectors, such as pads or lands to connect one die to one or more other dies. In one example, the interconnect bridge attaches a general or central processing unit to a graphics processing unit. In another example, the interconnect bridge attaches a central processing unit to memory. This allows the dies to communicate data directly between each other. Otherwise, these dies would send signals outside the package to hub or other device which would then send the data back into the package and to the other die. Other types of dies and connections may also be possible The die in such a package is embedded into the substrate. In one example, such a package is called an Embedded Interconnect Bridge (EmIB) architecture.

A die in such a package has a certain part of its total interconnect area used as a bridge attach region. For certain memory parts, the bridge may attach to about 20% of the C4 (Controlled Collapse Chip Connection) high density area of the memory chip. The high density interconnect area outside of the bridge attach region portion may contain power rails, test ports, etc. This area may use C4 or any of a variety of other connection technologies. The bridge is embedded into the package substrate and unlike silicon interposers, the embedded interconnect bridge die does not have through-silicon vias to enable power connections from outside the package to the bridge. This is in part because of the very thin structure of such a bridge.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

A die designed for an EmIB (Embedded Interconnect Bridge) architecture has one interconnect region to connect through the package substrate to external connections outside the package. Another interconnect region, a bridge attach region, of the die provides connections to the interconnect bridge within the package. The die also has power rails in the interconnect region of the die to allow connections to positive and ground plane power sources. The quality of data communication within the bridge attach region may be improved if there are power and ground pins within this region in addition to connectors for data communication. Power rails in the bridge attach region, may be separate from those outside and only accessible within the bridge attach region. The power may be supplied by the bridge, however, a separate power rail provides superior quality power and avoids additional stress on the bridge. As described below, using a unique configuration and connection, power can come directly from the package to the C4 area of the bridge attach region, and then be conducted to where it needs to go within the chip.

Figure 1:
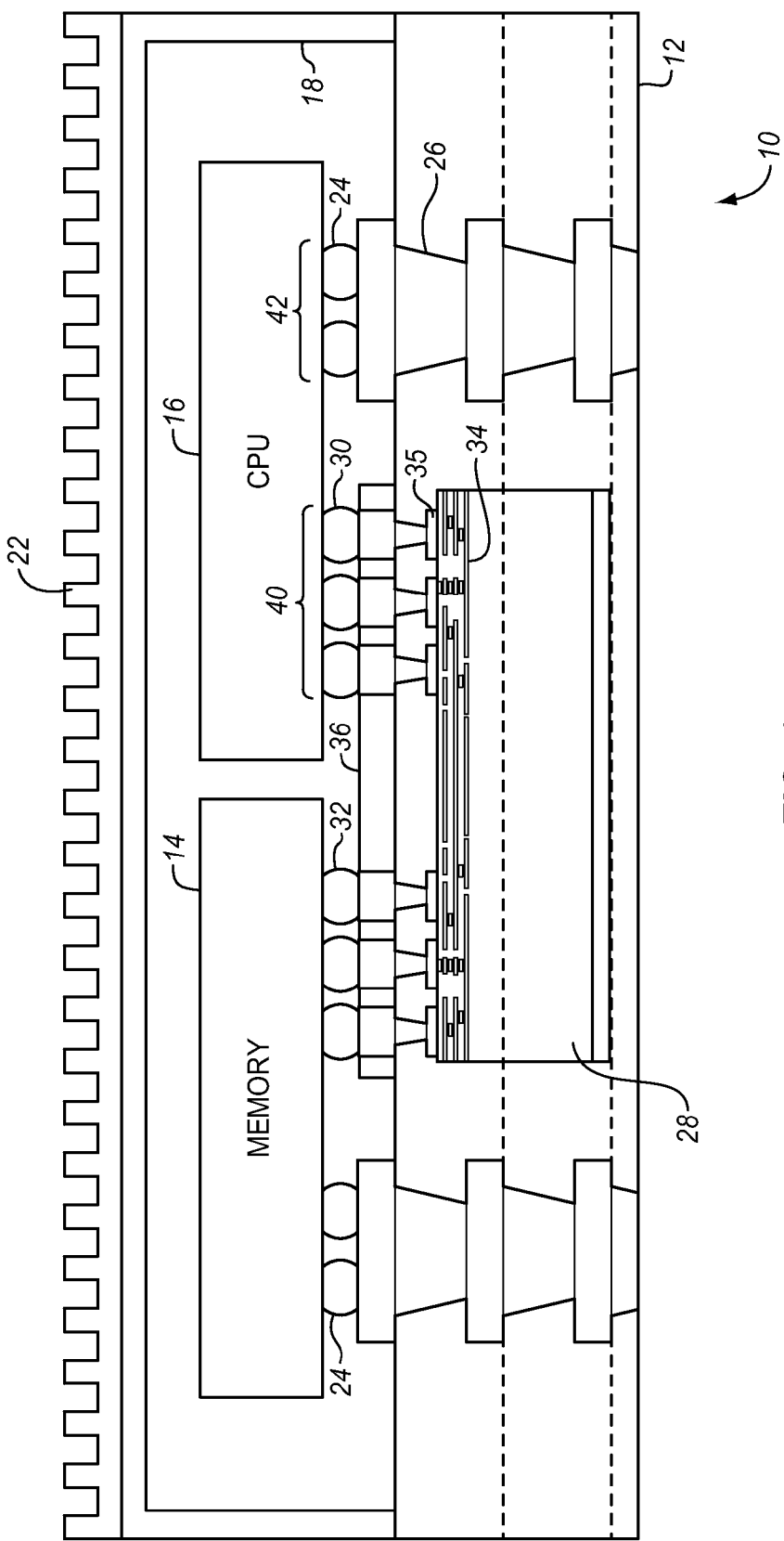
FIG. 1 is a cross-sectional diagram of a semiconductor package using an embedded interconnect bridge (EmIB) architecture according to an embodiment of the invention.

FIG. 1 is a cross-sectional diagram of a semiconductor package using an embedded interconnect bridge (EmIB) architecture. The package 10 is formed on a package substrate 12 that carries the semiconductor dies. In this case a memory die 14 and a central processing unit (CPU) 16 are fastened to the substrate. A cover 18 covers the substrate and the two dies. A cooling solution 22 such as cooling fins, as shown in this example, are attached to the top of the cover. A variety of different cooling solutions may be used such as conductive plates, integrated heat spreaders, liquid cooling, heat pipes, or radiative fins as shown depending on the particular embodiment. Alternatively, the package may be fabricated without the cooling solution and even without the cover.

The package substrate 12 can include internal low density interconnect routing for power and data. The substrate may be formed of a semiconductor material (e.g., a silicon, gallium, indium, germanium, or variations or combinations thereof, among other substrates), one or more insulating layers, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), any other dielectric material, such as glass, or any combination thereof, such as can be used in printed circuit boards (PCBs). The substrate can be made using a bumpless buildup layer process (BBUL) or other technique. A BBUL process includes one or more build-up layers formed underneath an element, such as a high density interconnect element or bridge 28 or a die 14, 16. A micro via formation process, such as laser drilling, can form connections between build-up layers and die bond pads. The build-up layers may be formed using a high-density integration patterning technology.

The two dies 14 and 16 are coupled through solder balls 24 and vias 26 to a power source outside the package (not shown). While only one pair of solder balls is shown for each die, coupled to a single via, there may be tens or hundreds of connection points for each die coupled through tens or hundreds of vias to connect the dies with the package and to external circuitry. The package may be connected directly to a printed circuit board (PCB) or coupled to a socket that is attached to some other device such as another (PCB). The solder ball 24 and via 26 connections may be used for power as well as for data input and output.

The first 14 and second 16 dies can include a low density interconnect pad 42, such as can be used for power, ground, or other electrical coupling. The low density interconnect pad can be electrically coupled, such as through a low density interconnect element 26, to a bus (not shown) such as a power, ground, or data bus. The low density interconnect pad can also be electrically coupled to an electrically conductive pad, such as through conductive adhesive (not shown). The conductive adhesive can be solder (e.g., solder paste), electroplating, or microball, such as a microball configured for flip chip interconnect (e.g., controlled collapse chip connection (C4) interconnect).

Embedded within the substrate is a bridge 28 also known as an interconnect bridge. The interconnect bridge provides connectors 30 to the CPU die and connectors 32 to the memory. The connectors may be through solder balls, C4 connection areas or any other preferred type of connection to make electrical connection from one die through the connectors into the bridge. The connections are made through pads on a bridge pad layer 35 on the top of the bridge. Interconnect layers 34 within the bridge make connections between the pins or lands on each die to pins or lands on the other die. In this way, the CPU and memory may communicate data and control information within the package.

As can be seen in FIG. 1 the CPU has a first interconnect area 40 closest to the memory for connecting through the embedded bridge to the memory. The CPU has a second interconnect area 42 for connecting with external vias for power and external data input and output. The second interconnect area 42 may be divided into power interconnect areas and data interconnect areas.

The bridge 28 includes electrically conductive pads at least partially on or in a top surface of the bridge. The electrically conductive pads can include conductive metal, such as copper, gold, silver, aluminum, zinc, nickel, brass, bronze, iron, etc. The electrically conductive pads can include a footprint with an area larger than a corresponding footprint of an interconnect area of a die. Such a configuration can allow for dimensional variation in manufacturing or in situating the bridge within the substrate.

In addition, a power rail 36 above the bridge pad layer 35 receives power from outside the package through separate power vias (not shown) and provides this power to the bridge interconnect area of the memory and CPU. The power rail may be formed of metal layers deposited printed over the substrate 12.

A dielectric layer can be formed over the bridge and the substrate. Conductive vias and solder connections can pass through the dielectric layer. The dielectric layer allows for dimensional variations in the placement, and embedding, the bridge and electrically isolates all of the interconnection areas. The dielectric layer can include oxide, or other materials, such as insulating materials.

Figure 2:
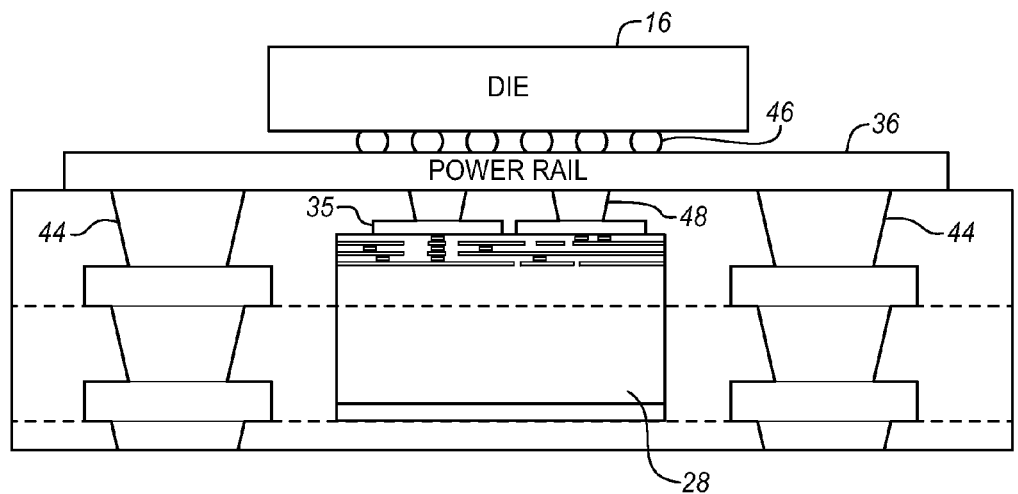
FIG. 2 is a cross-sectional diagram of the semiconductor package of FIG. 1 showing a power rail above the bridge according to an embodiment of the invention.

FIG. 2 is a cross sectional view of the package of FIG. 1 taken in a direction perpendicular to that of FIG. 1. As a result, only one die 16 can be seen. The other die is behind the die that is visible and is blocked in this view by the front die. The sides of the substrates as well as the top cover and other structures of the package have been cut away from this drawing for simplicity. The data interconnect areas 40 and external interconnect area 42 of the die are also not visible however the power rail 36 is clearly shown from this perspective.

The power rail extends across the width of both dies 14 and 16 and is coupled through external power vias 44 to an external power supply (not shown). The power is conducted up through the vias 44 into the power rail 36 and can be applied directly to the die through solder balls 46 between the power rail and the die. The bridge 28 can also be seen and may also be connected to the power rail 36 through pads at the bridge pad layer 35. A primary function of the power rail is to supply power directly into the die 16, however. in order to provide a parallel power path, secondary vias 48 as shown may be provided to connect the power rail to the bridge.

Figure 3:
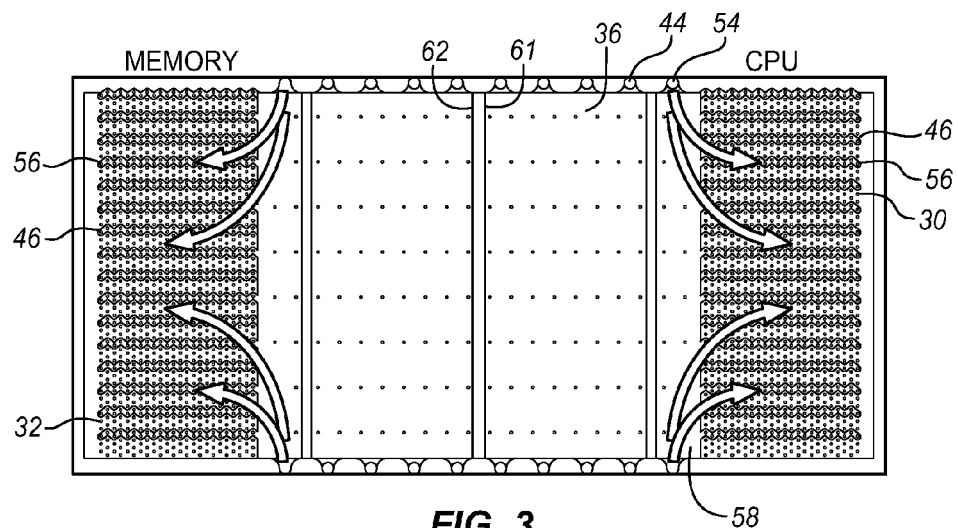
FIG. 3 is a top elevation view of a power rail for a package according to an embodiment of the invention.

FIG. 3 is a top elevation view of the power rail 36. In this case, the power rail rests between the two dies (not shown). In addition to a ground plane area 36 it also has a power plane area 58. The power rail for the ground plane 36 is coupled through a set of vias 44 to a source of power and ground outside of the package. Similarly, the power plane 58 is also coupled through vias 54 to a power source outside the package.

Power from the ground and power planes is conducted through rows of pins to connect with the bridge interconnect area on the CPU and memory. More specifically, the ground reference plane 36 is coupled through rows 46 of ground interconnection pins or pads to the bridge interconnect area 40 of the CPU 16. These may be, for example, in the form of C4 connection pads. The ground power plane 58 is also connected through rows of ground connection pins 56 also in the bridge interconnect area 40 of the CPU 16. On the other side of the power rail, the ground reference plane is coupled through C4 pins to the bridge interconnect area of the memory 14 and the power plane is similarly connected with interconnect pins to the memory die.

In the top elevation view of FIG. 3, data interconnect pins 30 are also visible in the CPU's bridge interconnect area. As shown, the data input/output connections 30 are interspersed among and between the power and ground connection pins. Similarly, on the memory die bridge interconnect area data input/output pins 32 are spread between alternative rows of power and ground connectors.

Figure 4:
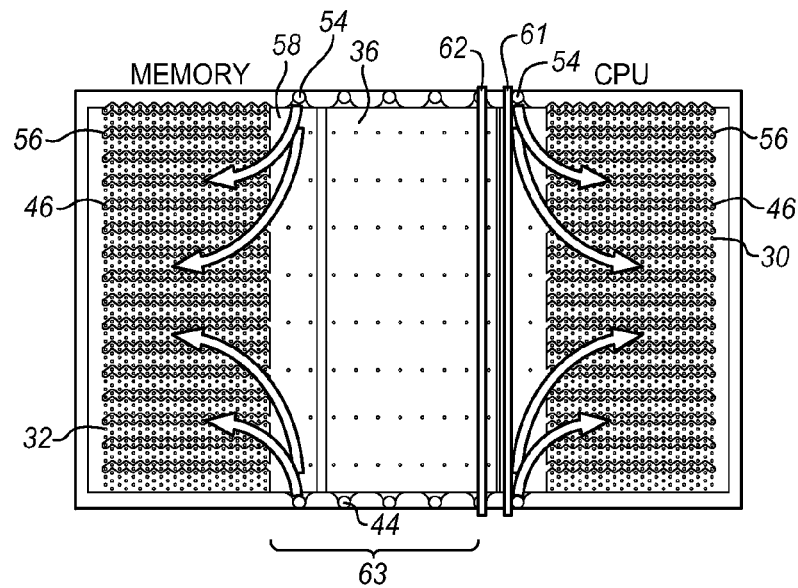
FIG. 4 is a top elevation view of an alternative power rail for a package according to an embodiment of the invention.

FIG. 4 shows a similar configuration of the ground rail and the power rail. In the example of FIG. 3, the power rail is placed centrally between the CPU and the memory dies. A vertical line 61 shows the edge of the CPU die and a second vertical line 62 shows the edge of the memory die. As can be seen, the power rail is centrally located between the two dies and power is drawn up through vias between the two dies and then transmitted and conducted laterally, as shown by the arrows, from the area between the dies into the two bridge interconnect areas.

FIG. 4 is a diagram of the same power rail as shown in FIG. 3. A ground reference plane 36 and a power reference plane 58 are coupled to external power sources through vias 44, 54 and conduct that external power laterally into the bridge interconnect areas of the two dies as shown by the transverse arrows. The power rail presents a set of ground interconnections 46 and a set of power inter connections 56 which are distributed among the data input/output connections 30 that extend up from the bridge through the connections in the power rail.

In the example of FIG. 4, the power rail is not placed directly between the two dies but instead is placed closer to the CPU die. A first line 61 marks the border of the CPU die showing that the bridge interconnect area of the CPU is very close to the edge 61 of the die. On the other hand, a parallel line 62 marks the edge of the memory die showing that there is a distance 63 between the edge of the memory die and the bridge interconnect area that is far greater for the memory die than for the CPU. Accordingly, the precise lateral location of the power rail and the positions of the corresponding dies may be modified to suit any particular implementation.

Figure 5:
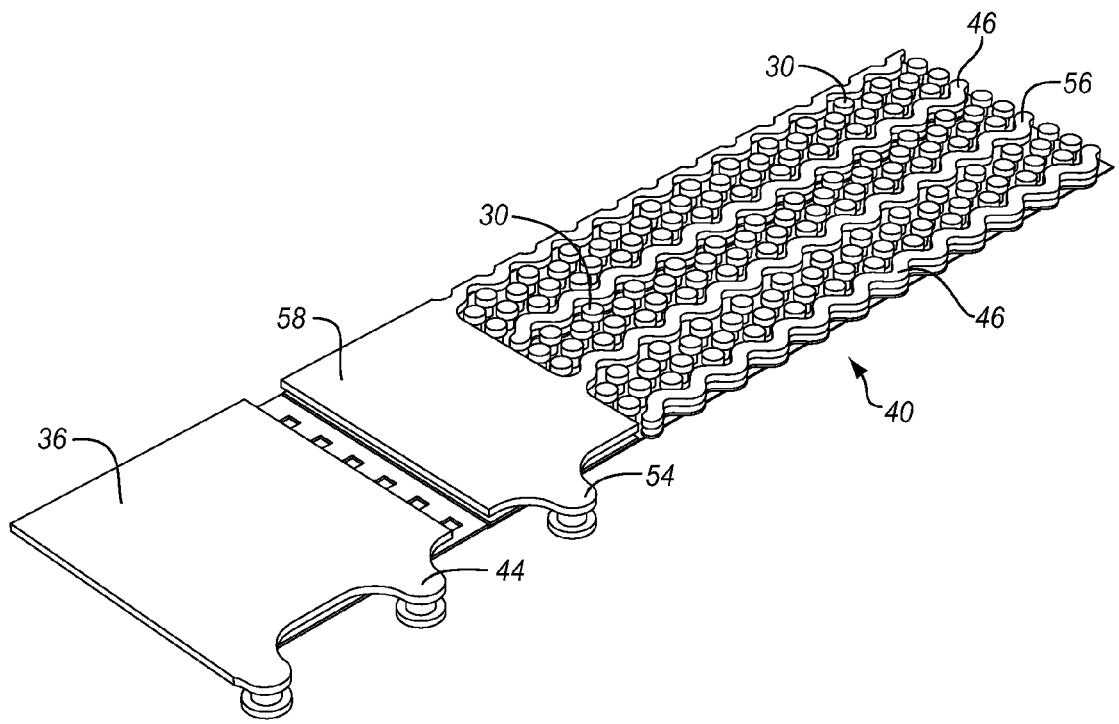
FIG. 5 is a perspective view of a power rail for a package according to an embodiment of the invention.

FIG. 5 is a perspective view of a portion of the power rail. The power plane 58 is again coupled through vias 54 that extend through the substrate (not shown) to external power. The power rail also has connection pads 56 that extend through a bridge interconnect area 40. The ground rail 36 similarly has vias 44 connected to external ground. The ground rail extends underneath the power rail and also has rows of ground connectors 46 within the bridge interconnect area. Input/output pins 30 extend up from the bridge to also connect to data input/output connections within the bridge interconnect area.

Figure 6:
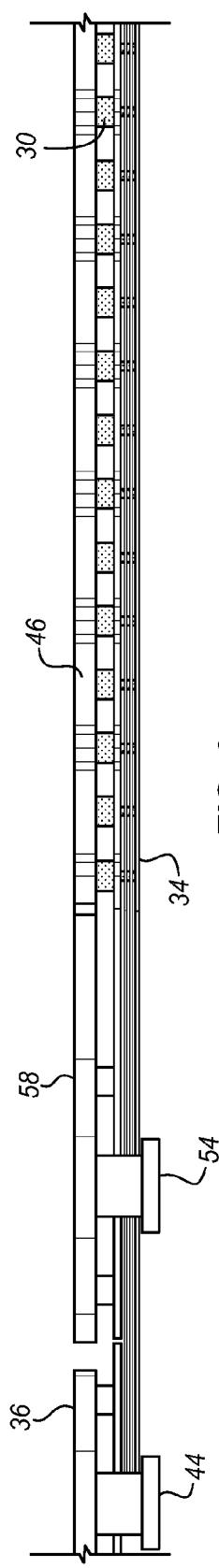
FIG. 6 is a side elevation view of a power rail for a package according to an embodiment of the invention.

FIG. 6 is a side cross sectional view of the power rail of FIG. 5 in which the power plane 58 is clearly visible with a via 54 extending through the bottom of the substrate. Similarly, the ground plane 36 has vias 44 that extend to a ground source. The ground plane extends underneath the power plane (not shown) to supply ground to a row of ground pins 46 in the die interconnection area. The power interconnection pins and the input/output pins are not visible in this cross sectional view but are blocked by the ground plane pins 46. The interconnect bridge 34 is beneath the power rail and supplies connections to data input/output pins 30 only one of which is visible the rest being obscured by the ground plane pins 46.

As shown by the arrows and the general configuration, power is brought laterally into the bridge interconnection areas on the package top substrate layer and the bridge pad layer 35. The bridge pad layer is the layer of conductive paths (typically copper) formed directly over the embedded interconnect bridge. The direction of current flow from the package vias, onto the plane of the top substrate layer and from there to the underlying pad layer, provides a short low resistance path.

The power rail may be constructed using the thicker copper layers of the top substrate layer and the bridge pad layer 35, as opposed to the much thinner layers within the embedded bridge 34. The power is brought directly to the bridge interconnect areas of the dies so that it does not have to be carried through the even thinner layers within the dies from connection points that are farther away. Memory die power delivery can be provided above the top of the embedded bridge within the die using package substrate vias placed just outside the bridge die. Power can then travel through metal layers on the top layer (layer-N) of the substrate.

Optionally, using more vias the power can connect to specially provided metal pads on the bridge die. The power rail configuration can also be used to connect data signals from outside the bridge to the top of the bridge. To further reduce DC resistance, the power rail can connect to layers within the bridge which provides parallel planes to the existing top substrate and bridge pad layers.

Figure 7:
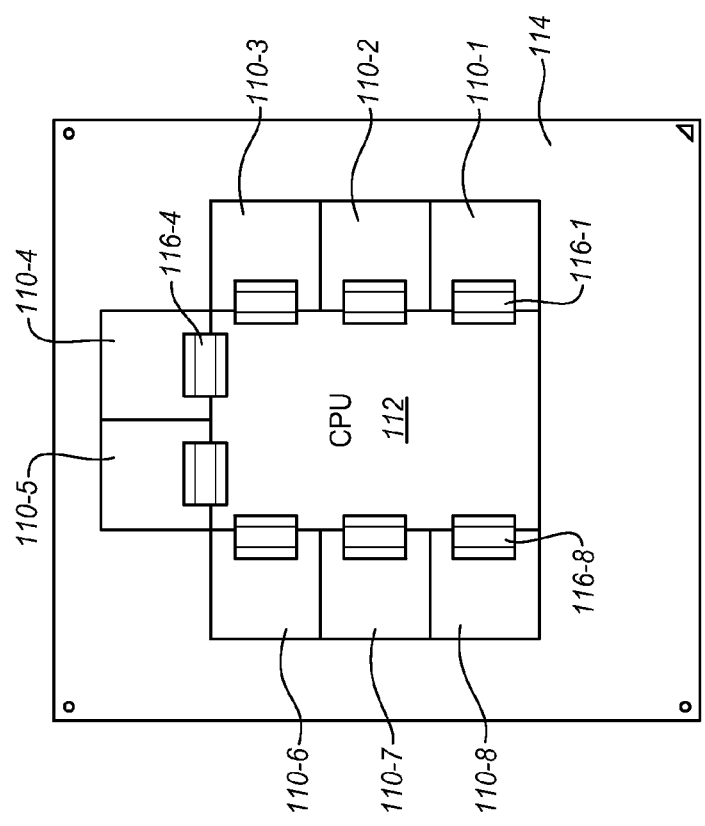
FIG. 7 is a diagram of a set of memory dies and a CPU attached to a common substrate according to an embodiment of the invention.

FIG. 7 is a diagram of a set of memory dies 110-1 to 110-8 coupled to a CPU 112. The CPU and each of the memory dies are fastened to a substrate 114 to which a package cover may be attached. On the opposite side of the substrate 114, there will be multiple interconnections for connecting to a socket or motherboard or to some other electronic device. Each memory die is coupled to the CPU through its own interconnect bridge 116-1 to 116-8. Each bridge allows the CPU to communicate directly with an intended one of the memory dies 110 for data input/output and other operations. The dies and substrates of FIG. 7 are provided only as an example. Other types of dies may be mounted to a substrate and connected in a similar way, depending on the particular embodiment.

Figure 8:
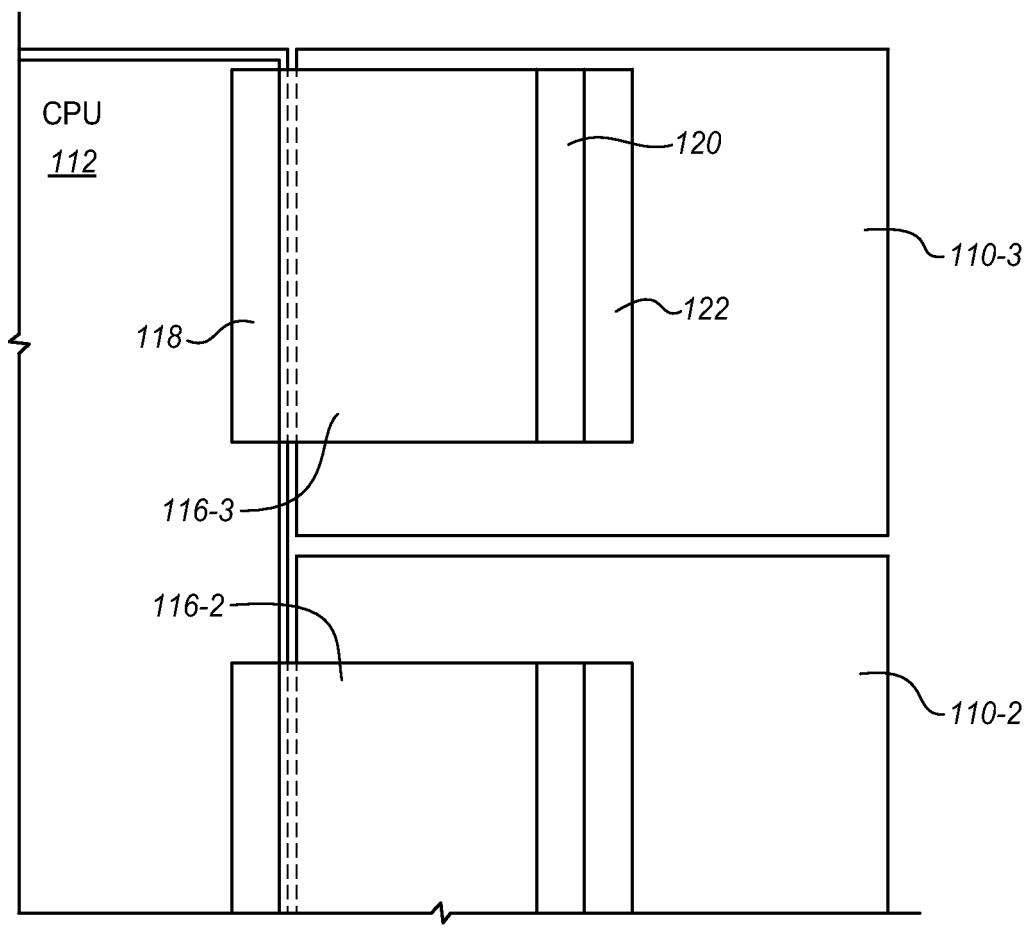
FIG. 8 is a detail of the diagram of FIG. 7 according to an embodiment of the invention.

FIG. 8 shows the connections between the CPU 112 and two of the memory dies 110-3 110-2 in more detail. The bridge 116 is between the CPU and memory die. It has a bridge interconnect area 118 to connect with the CPU and a second bridge interconnect area 120 to connect with the memory 110-3. The bridge 116-3, as described above, provides a connection between these two connection areas for direct communication between the two dies. There is another connection area 122 as shown which may be used for direct power to the memory. This connection area connects to the package and not to the bridge. A power supply for the CPU is not shown. The bridge 116-3 lies along only a narrow edge of the CPU but extends about into the middle of the memory die 110-3. This allows the interconnect of the memory to be more centrally located with the die easing fabrication, construction and connections within the die.

Figure 9:
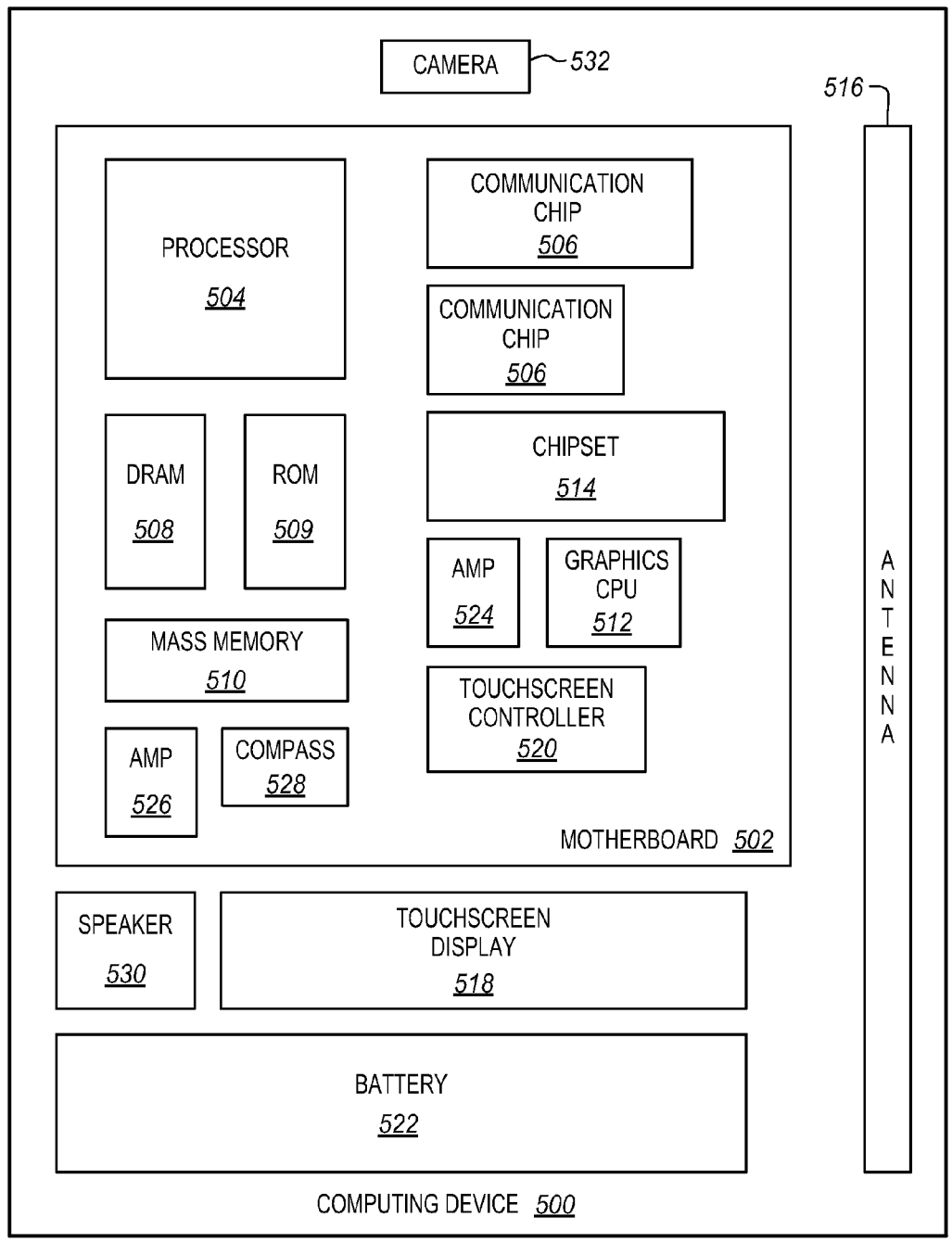
FIG. 9 is a block diagram of a computing device 500 in accordance with an embodiment of the invention.

FIG. 9 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are packaged with an embedded bridge and a power rail. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a semiconductor package including a substrate, a first semiconductor die having a first bridge interconnect region, a second semiconductor die having a second bridge interconnect region, a bridge embedded in the substrate, the bridge having a first contact area to connect to the first bridge interconnect region and a second contact area to connect to the second bridge interconnect region, and an external connection rail extending between the interconnect bridge and the first and second semiconductor dies to supply an external connection to the first and second bridge interconnect regions.

In further embodiments, the package further includes a plurality of vias through the substrate to connect the external connection rail to a power supply outside the package.

In further embodiments, the first contact area comprises data contacts to connect to the bridge and wherein the external connection rail comprises a first area between the first and second die coupled to vias for power and a second area extending into the first bridge interconnect region to supply power to contacts within the first bridge interconnect region.

In further embodiments, the external connection rail is further connected to the bridge to provide power to isolate the bridge interconnect region.

In further embodiments, the package the external connection rail is not embedded in the substrate.

In further embodiments, the external connection rail is above the substrate.

In further embodiments, the substrate has a top surface within the package to which the first and second dies are attached and wherein the external connection rail is attached to the top surface of the substrate.

In further embodiments, the device includes a dielectric layer over the bridge and wherein the external connection rail is over the dielectric layer In further embodiments, the first die is a processor die and the second die is a memory die.

Some embodiments pertain to an electronic computing device including a display, a user input device, and a processor to receive inputs from the user input device and present results on the display. The processor may be packaged in a package having a substrate, a first semiconductor die having a first bridge interconnect region, a second semiconductor die having a second bridge interconnect region, a bridge embedded in the substrate, the bridge having a first contact area to connect to the first bridge interconnect region and a second contact area to connect to the second bridge interconnect region, and an external connection rail above the bridge extending between the interconnect bridge and the first and second semiconductor dies to supply an external connection to the first and second bridge interconnect regions.

In further embodiments, the device further includes an internal power supply to power the display and the processor, wherein the rail is connected to the internal power supply and to the bridge to provide power to isolate the bridge interconnect region.

In further embodiments, the external connection rail is above the substrate.

In further embodiments, the processor package includes at least one memory die.

Some embodiments pertain to a method which includes forming a substrate, embedding a bridge in the substrate, the bridge having a first contact area and a second contact area, forming an external connection rail over the interconnect bridge to supply external connections, connecting a first semiconductor die to the bridge the first die having a first bridge interconnect region to connect to the first contact area of the bridge and to the power rail, connecting a second semiconductor die to the bridge, the second die having a second bridge interconnect region to connect to the second contact area of the bridge, and covering the die with a cover.

In further embodiments, the method includes drilling a plurality of vias through the substrate to connect the external connection rail to a power supply outside the package.

In further embodiments, the method includes connecting the substrate to a circuit board, wherein the external connection rail connected to an external power source.

In further embodiments, the method includes forming the rail by forming the rail above the bridge and the substrate.

In further embodiments, the substrate has a top surface within the package, the method further includes attaching the first and second dies and the external connection rail to the top surface of the substrate.

Some embodiments pertain to a semiconductor package including a substrate, a first semiconductor die having a first bridge interconnect region, a second semiconductor die having a second bridge interconnect region, means embedded in the substrate for bridging connections between the first and second die, the means for bridging having a first contact area to connect to the first bridge interconnect region and a second contact area to connect to the second bridge interconnect region, and means for externally connecting power, the external power means having an external connection rail extending between the means for bridging and the first and second semiconductor dies to supply external connections to the first and second bridge interconnect regions.

In further embodiments, the package includes means extending through the substrate for connecting the external connection rail to a power supply outside the package.

In further embodiments, the package the first contact area comprises data contacts to connect to the bridge and wherein the external connection rail comprises a first area between the first and second die coupled to vias for power and a second area extending into the first bridge interconnect region to supply power to contacts within the first bridge interconnect region.

What is claimed is:

1. A semiconductor package comprising:
   a substrate;
   a first semiconductor die having a first bridge interconnect region;
   a second semiconductor die having a second bridge interconnect region;
   a bridge embedded in the substrate, the bridge having a first contact area to connect to the first bridge interconnect region and a second contact area to connect to the second bridge interconnect region; and
   an external connection rail extending between the interconnect bridge and the first and second semiconductor dies to supply an external connection to the first and second bridge interconnect regions.

2. The package of claim 1, further comprising a plurality of vias through the substrate to connect the external connection rail to a power supply outside the package.

3. The package of claim 1, wherein the first contact area comprises data contacts to connect to the bridge and wherein the external connection rail comprises a first area between the first and second die coupled to vias for power and a second area extending into the first bridge interconnect region to supply power to contacts within the first bridge interconnect region.

4. The package of claim 3, wherein the external connection rail is further connected to the bridge to provide power to isolate the bridge interconnect region.

5. The package of claim 1, wherein the external connection rail is not embedded in the substrate.

6. The package of claim 1, wherein the external connection rail is above the substrate.

7. The package of claim 1, wherein the substrate has a top surface within the package to which the first and second dies are attached and wherein the external connection rail is attached to the top surface of the substrate.

8. The package of claim 1, further comprising a dielectric layer over the bridge and wherein the external connection rail is over the dielectric layer.

9. The package of claim 1, wherein the first die is a processor die and the second die is a memory die.

10. A semiconductor package comprising:
    a substrate;
    a first semiconductor die having a first bridge interconnect region;
    a second semiconductor die having a second bridge interconnect region;
    means embedded in the substrate for bridging connections between the first semiconductor die and the second semiconductor die, the means for bridging having a first contact area to connect to the first bridge interconnect region and a second contact area to connect to the second bridge interconnect region; and
    means for externally connecting power, the external power means having an external connection rail extending between the means for bridging and the first and second semiconductor dies to supply external connections to the first and second bridge interconnect regions.

11. The package of claim 10, further comprising means extending through the substrate for connecting the external connection rail to a power supply outside the package.

* * * * *